(12) United States Patent
Tsubomi

(10) Patent No.: US 11,257,937 B2
(45) Date of Patent: Feb. 22, 2022

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Kunihiro Tsubomi, Nonoichi Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 34 days.

(21) Appl. No.: 16/556,388

(22) Filed: Aug. 30, 2019

(65) Prior Publication Data

US 2020/0295167 A1    Sep. 17, 2020

(30) Foreign Application Priority Data

Mar. 11, 2019    (JP) .............................. JP2019-044024

(51) Int. Cl.
*H01L 29/739* (2006.01)
*H01L 27/06* (2006.01)
(Continued)

(52) U.S. Cl.
CPC ...... *H01L 29/7397* (2013.01); *H01L 27/0664* (2013.01); *H01L 29/063* (2013.01);
(Continued)

(58) Field of Classification Search
CPC ............. H01L 29/0696; H01L 29/0623; H01L 29/7397; H01L 29/063; H01L 29/7802;
(Continued)

(56) References Cited

U.S. PATENT DOCUMENTS 6,639,275 B2    10/2003    Ninomiya
6,781,200 B2    8/2004    Ishimura et al.
(Continued)

FOREIGN PATENT DOCUMENTS

| JP | 4090747 B2 | 5/2008 |
| JP | 4608133 B2 | 1/2011 |
| JP | 2018-170456 A | 11/2018 |

*Primary Examiner* — Vongsavanh Sengdara
(74) *Attorney, Agent, or Firm* — Allen & Overy LLP

(57) ABSTRACT

A semiconductor device includes a semiconductor body, a first electrode, a control electrode and a control interconnection electrically connected to the control electrode. The first electrode, the control electrode, and the control interconnection are provided on a front surface side of the semiconductor body. The control electrode is shaped as one body in a trench. The control electrode includes a first portion, a second portion, a first end portion and a second end portion that are arranged in a direction along the front surface of the semiconductor body. The first and second portions are positioned between the first and second end portions. The first portion is positioned between the first electrode and the semiconductor body, and the second portion is positioned between the control interconnection and the semiconductor body. The control interconnection crosses the second portion of the control electrode, and is electrically connected thereto.

12 Claims, 6 Drawing Sheets

(51) Int. Cl.
*H01L 29/861* (2006.01)
*H01L 29/06* (2006.01)
*H01L 29/10* (2006.01)

(52) U.S. Cl.
CPC ...... *H01L 29/0623* (2013.01); *H01L 29/1095* (2013.01); *H01L 29/861* (2013.01)

(58) Field of Classification Search
CPC ........... H01L 29/42376; H01L 29/1095; H01L 29/083; H01L 27/0664; H01L 29/861
See application file for complete search history.

(56) References Cited

U.S. PATENT DOCUMENTS

| | | | | |
|---|---|---|---|---|
| 2003/0141542 A1* | 7/2003 | Ishimura | ............ | H01L 29/7397 257/330 |
| 2015/0179441 A1* | 6/2015 | Onozawa | ............ | H01L 29/7395 257/109 |
| 2017/0141217 A1* | 5/2017 | Shirakawa | .......... | H01L 29/1095 |
| 2018/0286975 A1 | 10/2018 | Hatakenaka et al. | | |
| 2018/0294258 A1* | 10/2018 | Kamibaba | ............. | H01L 29/401 |
| 2018/0323294 A1* | 11/2018 | Okuda | .................. | H01L 29/861 |
| 2019/0326424 A1* | 10/2019 | Kamibaba | ......... | H01L 21/28114 |
| 2019/0326432 A1* | 10/2019 | Nakazawa | ........ | H01L 21/26586 |

* cited by examiner

SEMICONDUCTOR DEVICE

CROSS-REFERENCE TO RELATED APPLICATIONS

This application is based upon and claims the benefit of priority from Japanese Patent Application No. 2019-044024, filed on Mar. 11, 2019; the entire contents of which are incorporated herein by reference.

FIELD

Embodiments described herein relate generally to a semiconductor device.

BACKGROUND

A semiconductor device often has a trench gate structure in which a gate end is positioned in a high impurity concentration region. Thereby, it is possible to mitigate an electric field concentration at the gate end and enlarge the static breakdown voltage. However, there may be a case where the avalanche resistance is lowered by a current concentration due to impact ionizations during a turn-off period at the high impurity concentration region that protrudes into a drift region.

DETAILED DESCRIPTION

Figure 1:
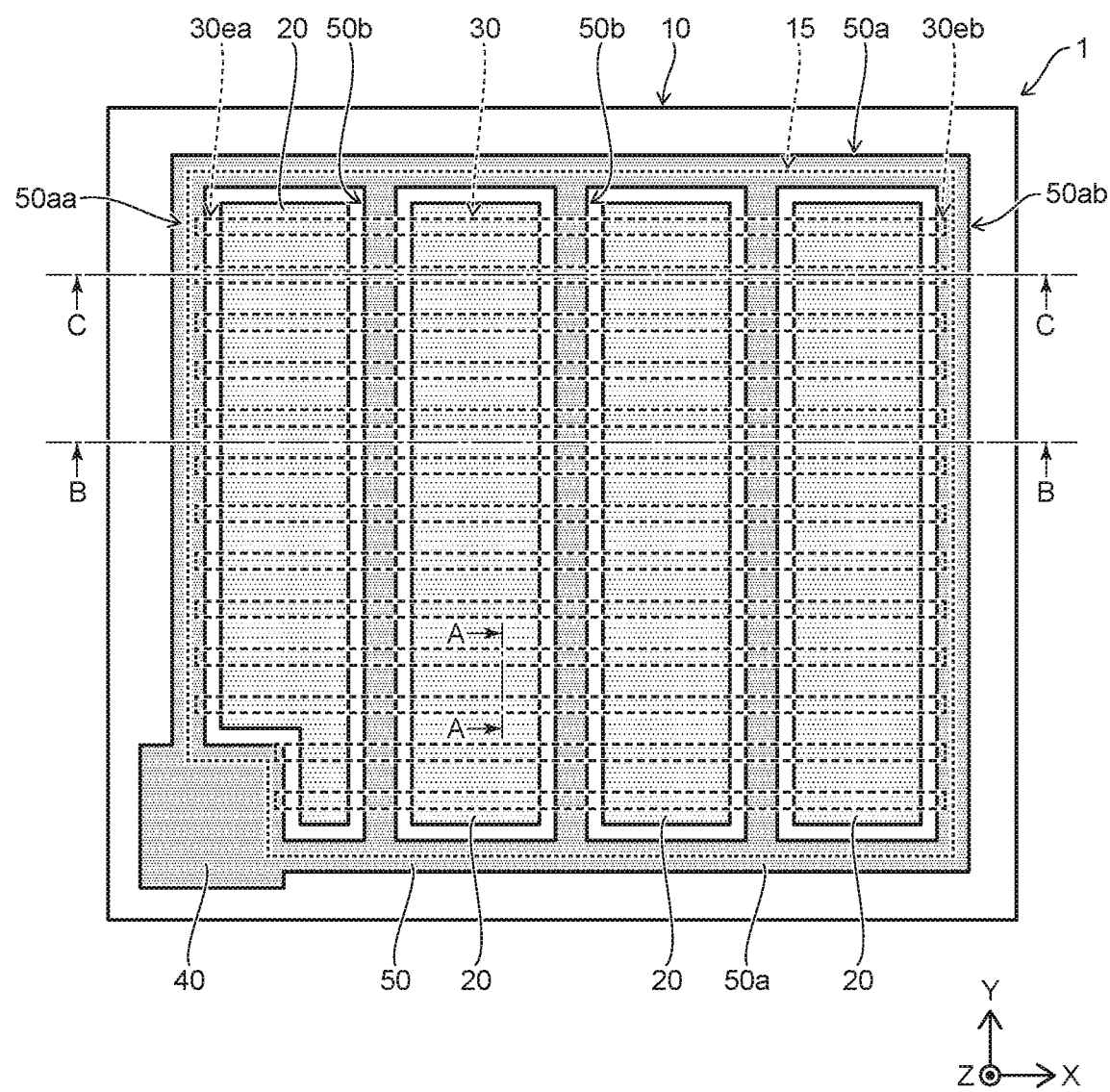
FIG. 1 is a schematic plan view showing a semiconductor device according to an embodiment.

According to one embodiment, a semiconductor device includes a semiconductor body, a first electrode, a control electrode and a control interconnection. The first electrode is selectively provided on a front surface of the semiconductor body. The control electrode is provided inside a trench on a front surface side of the semiconductor body. The control electrode is shaped as one body and electrically insulated from the semiconductor body via a first insulating film. The control interconnection is provided on the front surface of the semiconductor body. The control interconnection is electrically connected to the control electrode. The semiconductor body includes a first semiconductor layer of a first conductivity type, a second semiconductor layer of a second conductivity type and a third semiconductor layer of the first conductivity type. The second semiconductor layer includes a first region and a second region, and is electrically connected to the first electrode. The first region is positioned between the first electrode and the first semiconductor layer. The second region is positioned between the control interconnection and the first semiconductor layer. The third semiconductor layer is selectively provided between the first region of the second semiconductor layer and the first electrode. The third semiconductor layer is electrically connected to the first electrode. The control electrode extends in a first direction along the front surface of the semiconductor body. The control electrode faces the first semiconductor layer, the second semiconductor layer and at least a portion of the third semiconductor layer via the first insulating film. The control electrode is electrically insulated from the first electrode via a second insulating film. The control electrode includes a first portion, a second portion, a first end portion and a second end portion. The first portion, the second portion, the first end portion and the second end portion are arranged in the first direction. The first portion and the second portion are positioned between the first end portion and the second end portion. The first portion is positioned between the first electrode and the semiconductor body. The second portion is positioned between the control interconnection and the semiconductor body. The control interconnection includes a first interconnecting portion, a second interconnecting portion, and a third interconnecting portion. The first interconnecting portion is electrically connected to the first end portion of the control electrode. The second interconnecting portion is electrically connected to the second end portion of the control electrode. The third interconnecting portion is positioned between the first interconnecting portion and the second interconnecting portion. The third interconnecting portion extends in a second direction along the surface of the semiconductor body, the second direction crossing the first direction. The third interconnecting portion crosses the second portion of the control electrode, and is electrically connected to the second portion of the control electrode.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic plan view showing a semiconductor device 1 according to an embodiment. The semiconductor device 1 is, for example, an Insulated Gate Bipolar Transistor (IGBT). It should be noted that the embodiment described herein is an example, and is not limited to the IGBT.

The semiconductor device 1 includes, for example, a semiconductor body 10, an emitter electrode 20 (a first electrode), a gate electrode 30, a gate pad 40, and a gate interconnection 50. The semiconductor body 10 is, for example, made of silicon. The emitter electrode 20, the gate pad 40 and the gate interconnection 50 are provided on a front surface of the semiconductor body 10.

As shown in FIG. 1, the emitter electrode 20 is selectively provided on the front surface of the semiconductor body 10. The emitter electrode 20 is, for example, provided in a plurality and disposed on the front surface of the semiconductor body 10. The emitter electrodes 20 are, for example, arranged in the X-direction.

The gate pad 40 is disposed at, for example, one of four corners on the front surface of the semiconductor body 10. The gate interconnection 50 is linked to the gate pad 40 and disposed so as to surround the emitter electrodes 20. The gate interconnection 50 includes interconnecting portions 50a, 50b and 50c. The interconnecting portion 50a surrounds the plurality of emitter electrodes 20. The interconnecting portion 50b is disposed between the adjacent emitter electrodes 20. The interconnecting portion 50b is provided to be linked to the interconnecting portion 50a.

The gate electrode 30 extends in the X-direction, and includes portions placed between the semiconductor body 10 and the emitter electrodes 20 and other portions placed between the semiconductor body 10 and the gate interconnection 50. The gate electrode 30 includes, for example, a first end portion 30ea and a second end portion 30eb. The second end portion 30eb is positioned on a side opposite to the first end portion 30ea in the X-direction.

The interconnecting portion 50a of the gate interconnection 50 includes a first interconnecting portion 50aa and a second interconnecting portion 50ab. The first interconnecting portion 50aa is electrically connected to the first end portion 30ea of the gate electrode 30, and the second interconnecting portion 50ab is connected to the second end portion 30eb. The interconnecting portion 50b (the third interconnecting portion) is positioned between the first interconnecting portion 50aa and the second interconnecting portion 50ab. The interconnecting portion 50b crosses the gate electrode 30. The interconnecting portion 50b is electrically connected to the gate electrode 30 at a position where the interconnecting portion 50b crosses the gate electrode 30. The first interconnecting portion 50aa, the second interconnecting portion 50ab and the interconnecting portion 50b extend in the Y-direction, respectively.

Figure 2:
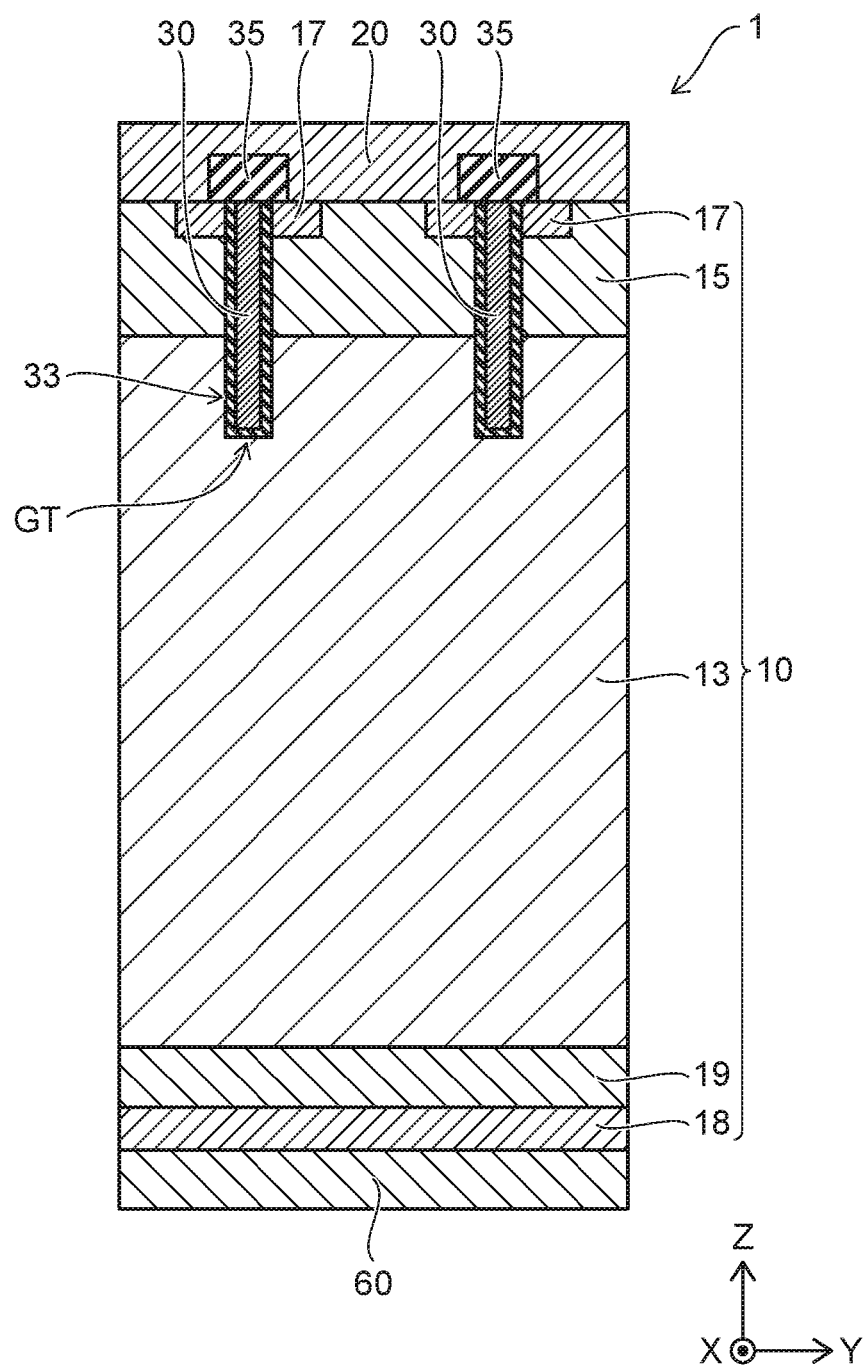
FIG. 2 is a schematic cross-sectional view showing the semiconductor device according to the embodiment.

FIG. 2 is a schematic cross-sectional view showing the semiconductor device 1 according to the embodiment. FIG. 2 is a schematic view showing the cross section along A-A line shown in FIG. 1. As shown in FIG. 2, the semiconductor device 1 further includes a collector electrode 60 provided on a back surface of the semiconductor body 10.

The semiconductor body 10 includes an n-type base layer 13, a p-type base layer 15, and an n-type emitter layer 17. The p-type base layer 15 is provided, for example, between the n-type base layer 13 and the emitter electrode 20. The n-type emitter layer 17 is selectively provided between the p-type base layer 15 and the emitter electrode 20. The n-type emitter layer 17 includes n-type impurities with a higher concentration than a concentration of n-type impurities in the n-type base layer 13. The emitter electrode 20 is electrically connected to the p-type base layer 15 and the n-type emitter layer 17.

The gate electrode 30 is disposed inside a gate trench GT provided on the front surface side of the semiconductor body 10. The gate electrode 30 is placed between the semiconductor body 10 and the emitter electrode 20, and is electrically insulated from the semiconductor body 10 via a gate insulating film 33. The gate electrode 30 is electrically insulated from the emitter electrode 20 via an interlayer insulating film 35. The gate insulating film 33 and the interlayer insulating film 35 are, for example, silicon oxide films.

The gate trench GT has a depth from the front surface of the semiconductor body 10 into the n-type base layer 13. The gate electrode 30 is provided so as to face the n-type base layer 13, the p-type base layer 15 and at least a portion of the n-type emitter layer 17 via the gate insulating film 33.

The semiconductor body 10 further includes a p-type collector layer 18 and an n-type buffer layer 19. The p-type collector layer 18 is provided between the n-type base layer 13 and the collector electrode 60. The collector electrode 60, for example, contacts the p-type collector layer 18 and is electrically connected to the p-type collector layer 18. The n-type buffer layer 19 is provided between the n-type base layer 13 and the p-type collector layer 18. The n-type buffer layer 19 includes n-type impurities with a higher concentration than a concentration of the n-type impurities in the n-type base layer 13.

Figure 3A:
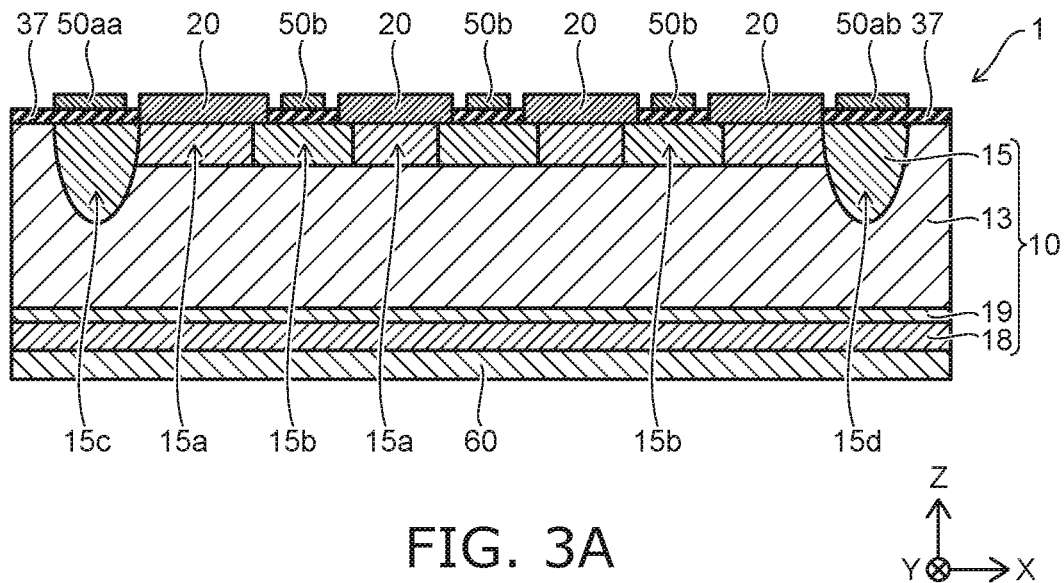
FIGS. 3A and 3B are other schematic cross-sectional views showing the semiconductor device according to the embodiment.
Figure 3B:
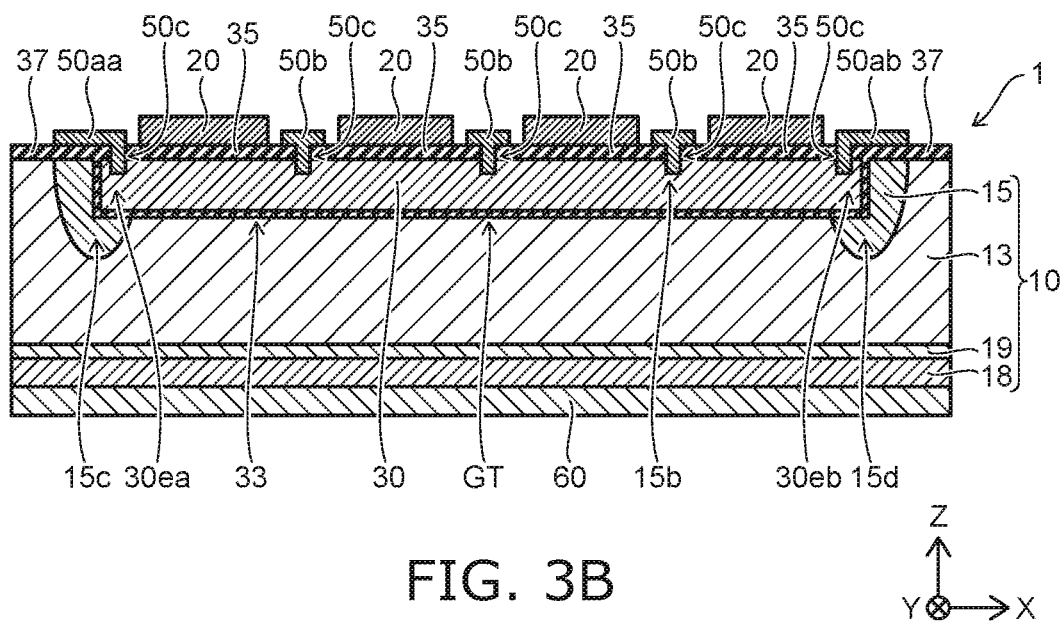

FIGS. 3A and 3B are other schematic cross sectional views showing the semiconductor device 1 according to the embodiment. FIG. 3A is a schematic view showing the cross section along B-B line shown in FIG. 1. FIG. 3B is a schematic view showing the cross section along C-C line shown in FIG. 1.

As shown in FIG. 3A, the p-type base layer 15 includes a first region 15a, a second region 15b, a third region 15c and a fourth region 15d. The first region 15a is placed between the n-type base layer 13 and one of the emitter electrodes 20. The second region 15b is placed between the n-type base layer 13 and the interconnecting portion 50b. The third region 15c is placed between the n-type base layer 13 and the first interconnecting portion 50aa. The fourth region 15d is placed between the n-type base layer 13 and the second interconnecting portion 50ab. The second region 15b, the third region 15c and the fourth region 15d directly contact the emitter electrode 20 or are electrically connected to the emitter electrode 20 via the first region 15a. The first region 15a, for example, includes a contact portion (not shown) contacting the emitter electrode 20 and including p-type impurities with a higher concentration.

The second region 15b, the third region 15c and the fourth region 15d include p-type impurities with a higher concentration than a concentration of the p-type impurities in the first region 15a. The first region includes, for example, the p-type impurities in a concentration range of not less than $1 \times 10^{16}$ cm$^{-3}$ and less than $1 \times 10^{18}$ cm$^{-3}$. The second region 15b, the third region 15c and the fourth region 15d include, for example, the p-type impurity in a concentration range of not less than $1 \times 10^{18}$ cm$^{-3}$ and less than $1 \times 10^{21}$ cm$^{-3}$.

The third region 15c has a width in a direction perpendicular to the front surface of the semiconductor body 10 (e.g., the Z-direction) wider than widths of the first region 15a and the second region 15b in the Z-direction. The fourth region 15d has a width in the Z-direction wider than each width of the first region 15a and the second region 15b in the Z-direction. The second region 15b has the width in the Z-direction, for example, the same as or wider than the width of the first region 15a in the Z-direction.

The gate interconnection 50 is, for example, electrically insulated from the semiconductor body 10 via an interlayer insulating film 37. The interlayer insulating film 37 is placed between the second region 15b of the p-type base layer 15 and the interconnecting portion 50b. The interlayer insulating film 37 is also placed between the third region 15c of the p-type base layer 15 and the first interconnecting portion 50aa, and between the fourth region 15d and the second interconnecting portion 50ab. The gate pad 40 is electrically insulated from the semiconductor body 10 via the interlayer insulating film 37 in a portion not shown. The insulating film 37 is, for example, a silicon oxide film, and may be formed with the insulating film 35.

As shown in FIG. 3B, the gate electrode 30 extends in the X-direction inside the gate trench GT. The gate electrode 30 is provided in the gate trench GT as an electrode shaped as one body. The gate electrode 30 includes the portions positioned between the n-type base layer 13 and the emitter electrodes 20 and other portion positioned between the n-type base layer 13 and the interconnecting portion 50b. The gate electrode 30 includes the first end portion 30ea and the second end portion 30eb. The first end portion 30ea is positioned between the n-type base layer 13 and the first interconnecting portion 50aa. The first end portion 30ea is positioned in the third region 15c of the p-type base layer 15. The second end portion 30eb is positioned between the n-type base layer 13 and the second interconnecting portion 50ab. The second end portion 30eb is positioned in the fourth region 15d of the p-type base layer 15.

The third region 15c and the fourth region 15d each have a width in the Z-direction wider than a width of the gate electrode 30 in the Z-direction. The third region 15c and the fourth region 15d each extend in the Y-direction (see FIG. 1). The gate electrode 30 is provided in a plurality. The third region 15c is provided so as to cover a side surface and a bottom surface of the first end portion 30ea of each gate electrodes 30. The fourth region 15d is provided so as to cover a side surface and a bottom surface of the second end portion 30eb of each gate electrode 30.

The first region 15a and the second region 15b have widths in the Z-direction, respectively, which are narrower than the width of the gate electrode 30 in the Z-direction. The first region 15a and the second region 15b are provided respectively in a plurality in each gate electrode 30. The first regions 15a are divided by the gate trench GT and arranged in the Y-direction. The first regions 15a are separated from each other in the Y-direction. The second gates 15b are divided by the gate trench GT and arranged in the Y-direction. The second regions 15b are separated from each other in the Y-direction.

As shown in FIG. 3B, the first interconnecting portion 50aa, the second interconnecting portion 50ab and the interconnecting portion 50b are electrically connected to the gate electrode 30 via contact plugs 50c. The contact plugs 50c have, for example, a length in the Z-direction capable of extending through the interlayer insulating film 37 and reaching the gate electrode 30. The gate interconnection 50 includes the contact plugs 50c that is so called a damascene interconnection, and includes, for example, tungsten and like.

Figure 4A:
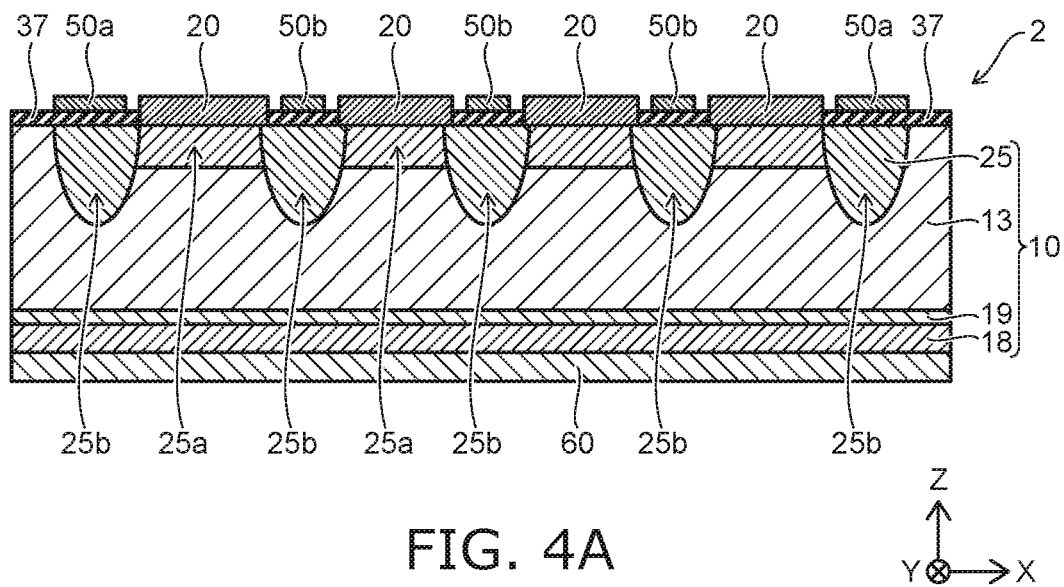
FIGS. 4A and 4B are schematic cross-sectional views showing a semiconductor device according to a comparative example.
Figure 4B:
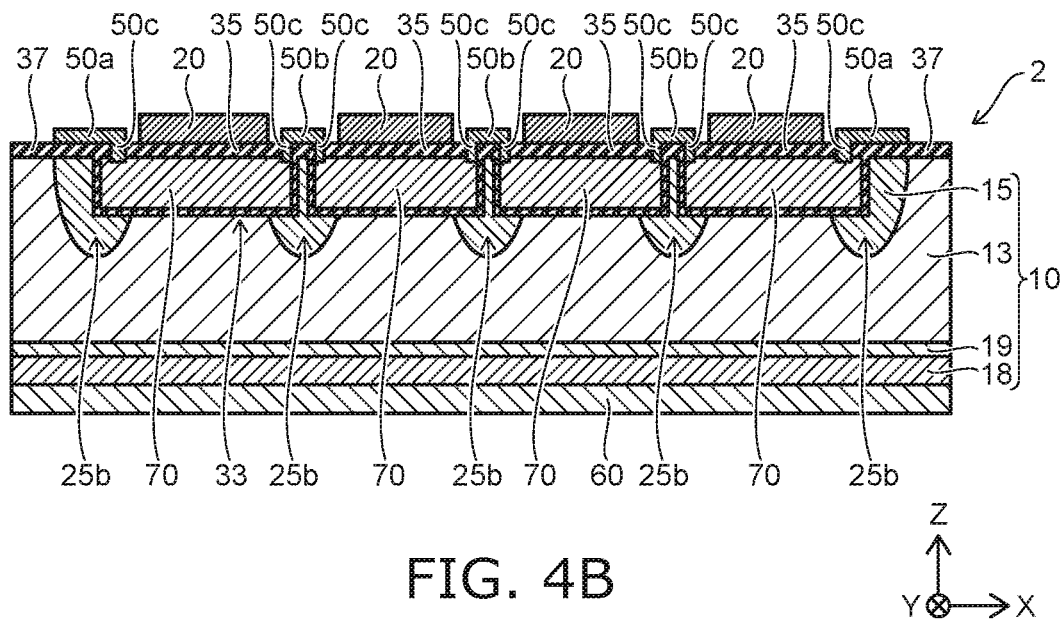

FIGS. 4A and 4B are schematic cross-sectional views showing a semiconductor device 2 according to a comparative example. FIG. 4A is a schematic view showing a cross section corresponding to the cross section along B-B line shown in FIG. 1. FIG. 4B is a schematic view showing a cross section corresponding to the cross section along C-C line shown in FIG. 1.

As shown in FIG. 4A, the semiconductor body 10 includes the n-type base layer 13, and a p-type bas layer 25. The p-type base layer 25 includes first regions 25a and second regions 25b. The first regions 25a are positioned between the n-type base layer 13 and the emitter electrodes 20. The second regions 25b are positioned between the n-type base layer 13 and the first interconnecting portion 50aa, between the n-type base layer 13 and the second interconnecting portion 50ab and between the n-type base layer 13 and the interconnecting portion 50b, respectively.

The second regions 25b each include p-type impurities with a higher concentration than a concentration of p-type impurities in the first regions 25a. The second region 25b each have a width in the Z-direction wider than the width in the Z-direction of the first regions 15a.

As shown in FIG. 4B, the semiconductor device 2 includes a plurality of gate electrodes 70 arranged in the Y-direction. The gate electrodes 70 are placed respectively between the n-type base layer 13 and the emitter electrodes 20. The gate electrodes 70 have end portions that are positioned between the n-type base layer 13 and the first interconnecting portion 50aa, between the n-type base layer 13 and the second interconnecting portion 50ab, and between the n-type base layer 13 and the interconnecting portion 50b, respectively. The end portions of the gate electrodes 70 are positioned in the second regions 25b of the p-type base layer 25, respectively.

The second regions 25b have a width in the Z-direction wider than the width of the gate electrodes 70 in the Z-direction. Accordingly, the end portions of the gate electrodes 70 are covered with the second regions 25b. Thereby, it is possible to mitigate the electric field concentrations at the end portions of the gate electrodes 70 and to achieve the high static breakdown voltage of the semiconductor device 2 in the turn-off state.

However, while turning off the semiconductor device 2, space charges (holes) in the n-type base layer 13 are discharged to the emitter electrode 20 through the second regions 25b of the p-type base layer 25. The second regions 25b directly contact the emitter electrode 20 or are electrically connected to the emitter electrode 20 via the first regions 25a. The second regions 25b include p-type impurities with a higher concentration than a concentration of p-type impurities in the first regions 25a and have a shape protruding into the n-type base layer 13. The electric field concentrations easily occur in the second regions 25b as compared to the first regions 25a. Thus, the avalanche currents concentrate in the second regions 25b during the turn-off period, and make the avalanche resistance of the semiconductor device 2 lower.

In contrast, the gate electrode 30 extends continuously along the X-direction in the semiconductor device 1, and the first end portion 30ea and the second end portion 30eb are positioned in the third region 15c and the fourth region 15d of the p-type base layer 15, respectively.

The third region 15c and the fourth region 15d each include p-type impurities with a higher concentration than the concentration of p-type impurities in the first region 15a, and have a shape protruding into the n-type base layer 13. However, the third region 15c and the fourth region 15d are positioned at a boundary between the active region, which includes the p-type base layer 15 and the gate electrode 30, and a terminal region around the active region. Accordingly, it is possible to suppress the avalanche currents flowing into the third region 15c and the fourth region 15d by providing the mitigating structure of electric field in the terminal region such as a guard ring or a Reduced Surface Field (RESURF) structure.

Furthermore, in the semiconductor device 1, the second region 15b is provided to have the width in the Z-direction narrower than the width of the gate electrode 30 in the Z-direction. Thus, the electric field is reduced at the pn junction between the n-type base layer 13 and the second region 15b, and it is possible to suppress the avalanche current.

As described above, in the semiconductor device 1 according to the embodiment, it is possible to improve the static breakdown voltage at the turn-off state and to improve the avalanche resistance during the turn-off period.

Figure 5A:
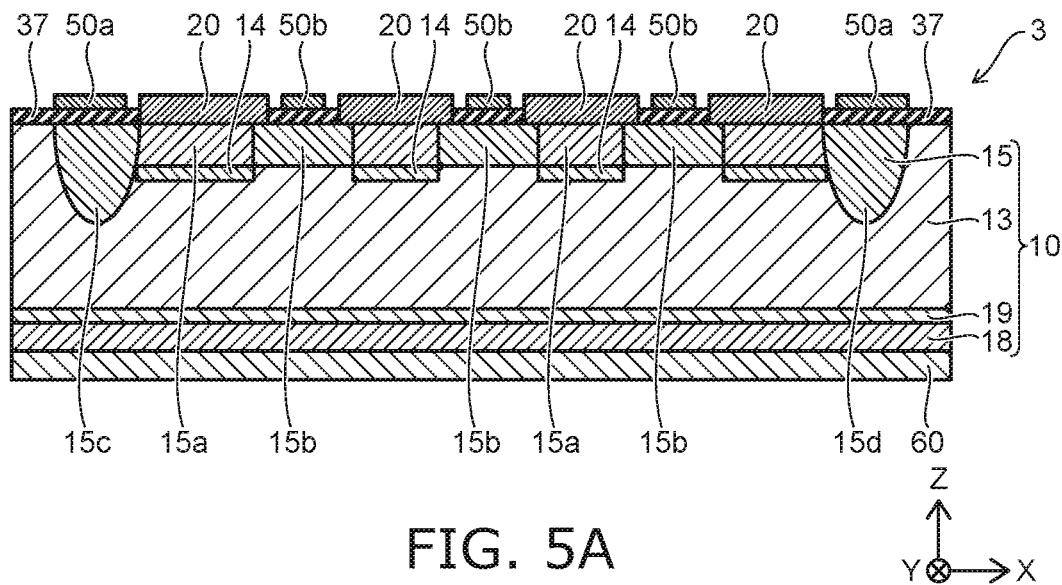
FIGS. 5A and 5B are schematic cross-sectional views showing a semiconductor device according to a variation of the embodiment.
Figure 5B:
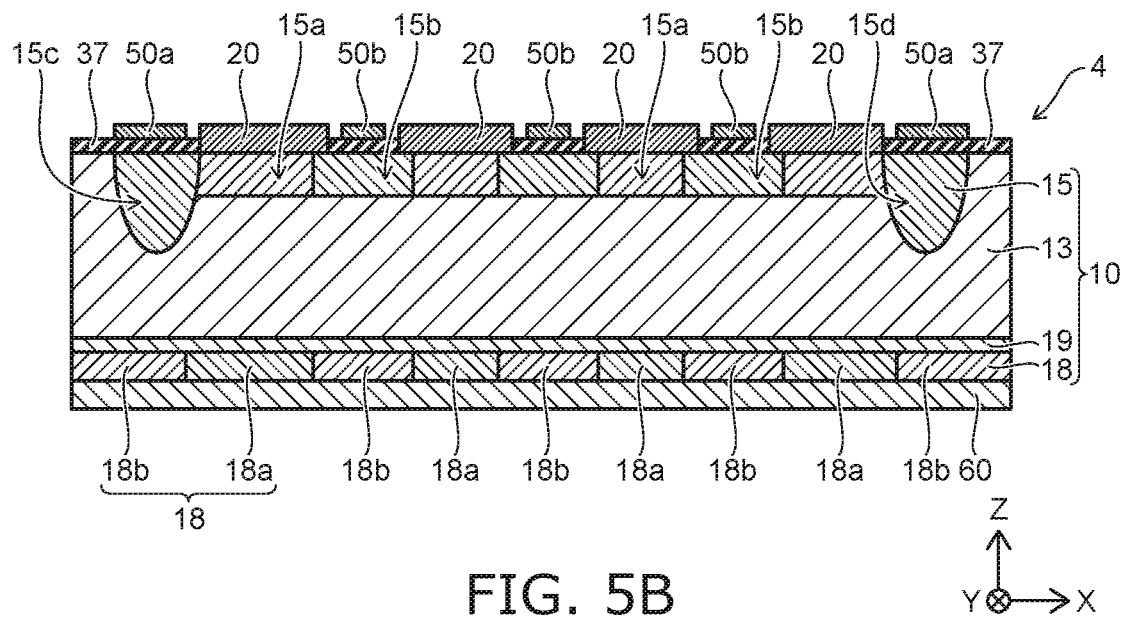

FIGS. 5A and 5B are schematic cross sectional views showing semiconductor devices 3 and 4 according to variations of the embodiment. Both of the semiconductor devices 3 and 4 comprise the p-type base layer 15 including the first region 15a, the second region 15b, the third region 15c and the fourth region 15d. The semiconductor devices 3 and 4 include the gate electrode 30 having the configuration shown in FIG. 3B.

As shown in FIG. 5A, the semiconductor body 10 of the semiconductor device 3 further includes n-type barrier layers 14. The n-type barrier layers 14 are provided between the n-type base layer 13 and the first regions 15a of the p-type base layer 15, respectively. The n-type barrier layers 14 each include, for example, n-type impurities with a higher concentration than a concentration of n-type impurities in the n-type base layer 13. The n-type barrier layers 14 each include n-type impurities with a lower concentration than the concentration of n-type impurities in the n-type emitter layer 17 (see FIG. 2).

In the semiconductor device 3, barrier to the holes is generated at the interface between the n-type base layer 13 and the n-type barrier layer 14 by providing the n-type barrier layer 14. Thereby, it is possible to facilitate the charge accumulation effect in the n-type base layer 13 and reduce ON resistance.

As shown in FIG. 5B, in the semiconductor device 4, the p-type collector layer 18 includes first collector regions 18a and second collector regions 18b. A first collector region 18a is positioned between an emitter electrode 20 and the collector electrode 60. The second collector regions 18b are positioned between the gate interconnection 50 and the collector electrode 60. The first collector region 18a is positioned below the first region 15a of the p-type base layer 15 with the n-type base layer 13 interposed. A second collector region 18b is positioned below the second region 15b of the p-type base layer 15 with the n-type base layer 13 interposed. Other second collector regions 18b may be positioned below the third region 15c and the fourth region 15d of the p-type base layer 15 with the n-type base layer 13 interposed.

The second collector region 18b includes p-type impurities with a lower concentration than a concentration of p-type impurities in the first collector region 18a. Therefore, it is possible to suppress the hole injection from the second collector region 18b to the n-type base layer 13 when turning on the semiconductor device 4. As a result, it is possible to reduce the discharge amount of holes when turning off the semiconductor device 4, and suppress the avalanche current. Thereby, the avalanche resistance can be improved in the semiconductor device 4.

Figure 6:
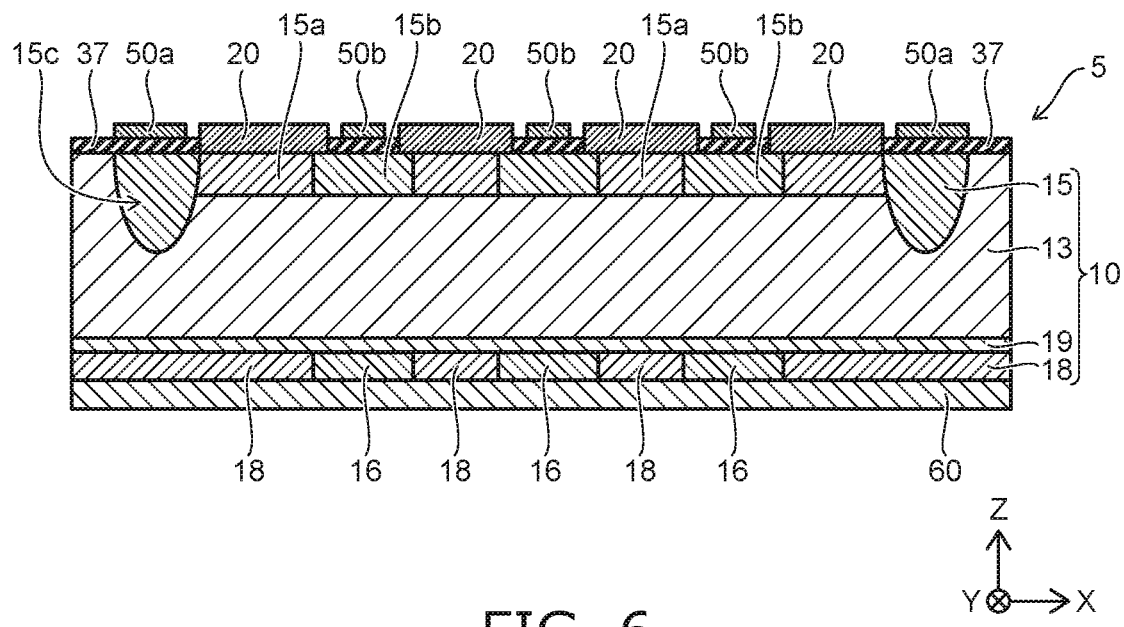
FIG. 6 is a schematic cross-sectional view showing a semiconductor device according to other variation of the embodiment.

FIG. 6 is a schematic cross sectional view showing a semiconductor device 5 according to other variation of the embodiment. The semiconductor device 5 includes the p-type base layer 15 including the first regions 15a, the second regions 15b, the third region 15c and the fourth region 15d. The semiconductor device 5 includes the gate electrode 30 having the configuration shown in FIG. 3B.

As shown in FIG. 6, the semiconductor body 10 of the semiconductor device 5 includes n-type reverse conducting layers 16 and the p-type collector layers 18 disposed between the n-type buffer layer 19 and the collector electrode 60. A p-type collector layer 18 is placed between an emitter electrode 20 and the collector electrode 60. An n-type reverse conducting layer 16 is placed between an interconnecting portion 50b of the gate interconnection 50 and the collector electrode 60. The p-type collector layer 18 is placed below the first region 15a of the p-type base layer 15 with the n-type base layer 13 interposed. The n-type reverse conducting layer 16 is placed below the second region 15b of the p-type base layer 15 with the n-type base layer 13 interposed.

The n-type reverse conducting layer 16 is formed, for example, by selectively ion-implanting phosphorous (P) that is the n-type impurity. The p-type collector layer 18 is formed, for example, by selectively ion-implanting boron (B) that is the p-type impurity. The n-type impurities may not be introduced into the region that is to be the n-type reverse conducting layer 16. That is, the n-type reverse conducting layer 16 may be formed so as to have the same impurity concentration as the silicon wafer serving as a base. The n-type reverse conducting layer 16 includes, for example, the n-type impurities with generally substantially the same concentration as the concentration of the n-type impurities in the n-type base layer 13.

In this example, it is possible in the semiconductor device 5 to improve the turn-off characteristics by providing the n-type reverse conducting layers 16. Moreover, it is possible to simplify a circuit configuration of power control equipment using the semiconductor device 5.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A semiconductor device, comprising:
a semiconductor body including a first semiconductor layer of a first conductivity type;
a first electrode selectively provided on a front surface of the semiconductor body;
a control electrode provided inside a trench on a front surface side of the semiconductor body, the control electrode being provided with one body and electrically insulated from the semiconductor body via a first insulating film; and
a control interconnection provided on the front surface of the semiconductor body, the control interconnection being electrically connected to the control electrode, the control interconnection being apart from the first electrode,
the semiconductor body further including a second semiconductor layer of a second conductivity type and a third semiconductor layer of the first conductivity type,
the second semiconductor layer including a first region and a second region, the second region being arranged next to the first region in a first direction, the first direction being along a boundary between the first and second semiconductor layers, the first region being positioned between the first electrode and the first semiconductor layer, the second region being positioned between the control interconnection and the first semiconductor layer, the second region including a second conductivity type impurity with a higher concentration than a concentration of a second conductivity type impurity in the first region, the third semiconductor layer being selectively provided between the first region of the second semiconductor layer and the first electrode, the second and third semiconductor layers being electrically connected to the first electrode, the control electrode extending in the first direction, the control electrode facing the first semiconductor layer, the second semiconductor layer and at least a portion of the third semiconductor layer via the first insulating film, the control electrode being electrically insulated from the first electrode via a second insulating film, the control electrode including a first portion, a second portion, a first end portion and a second end portion, the first and second portions and the first and second end portions being arranged in the first direction, the first portion and the second portion being positioned between the first end portion and the second end portion, the first portion being positioned between the first electrode and the semiconductor body, the control interconnection including a first interconnecting portion, a second interconnecting portion, and a third interconnecting portion, the first to third interconnecting portions being arranged in the first direction, the third interconnecting portion being provided between the first and second interconnecting portions, the first end portion of the control electrode being provided between the first interconnecting portion and the semiconductor body, the second end portion of the control electrode being provided between the second interconnecting portion and the semiconductor body, the second portion of the control electrode being provided between the third interconnecting portion and the semiconductor body, the third interconnecting portion extending in a second direction along the surface of the semiconductor body, the second direction crossing the first direction, the third interconnecting portion crossing the second portion of the control electrode.

2. The device according to claim 1, wherein
the first interconnecting portion and the second interconnecting portion extend in the second direction.

3. The device according to claim 1, wherein
the second semiconductor layer further includes a third region and a fourth region, the first to fourth regions being arranged in the first direction, the first region and the second region being positioned between the third region and the fourth region,
the second region being positioned between the first semiconductor layer and the third interconnecting portion,
the third region being positioned between the first semiconductor layer and the first interconnecting portion,
the fourth region being positioned between the first semiconductor layer and the second interconnecting portion,
the third region and the fourth region having a width wider than a width of the control electrode in a third direction perpendicular to the front surface of the semiconductor body,
the first end portion of the control electrode is positioned in the third region, and
the second end portion of the control electrode is positioned in the fourth region.

4. The device according to claim 3, wherein
the first region and the second region have a width in the third direction narrower than the width of the control electrode in the third direction.

5. The device according to claim 1, wherein
the third interconnecting portion of the control interconnection is provided on the control electrode via a third insulating film, the third interconnecting portion being electrically connected to the control electrode via a contact plug extending through the third insulating film.

6. The device according to claim 5, wherein
the first and second interconnecting portions of the control interconnection are provided on the control electrode via the third insulating film, the first and second interconnecting portions being electrically connected to the control electrode via other contact plugs, respectively, the other control plugs extending through the third insulating film.

7. The device according to claim 5, further comprising:
a control pad provided on the front surface of the semiconductor body via the third insulating film, the control pad being spaced apart from the first electrode, the control interconnection being linked to the control pad.

8. The device according to claim 1, wherein
the control electrode and the trench are provided respectively in a plurality, a plurality of control electrode being arranged in the second direction, the plurality of control electrodes being disposed in a plurality of trenches, respectively, and
the third interconnecting portion of the control interconnection crosses the plurality of control electrodes, the third interconnecting portion being electrically connected to the plurality of control electrodes.

9. The device according to claim 1, further comprising:
a second electrode provided on a back surface of the semiconductor body, wherein
the semiconductor body further includes a fourth semiconductor layer of the second conductivity type provided between the first semiconductor layer and the second electrode.

10. The device according to claim 9, wherein the fourth semiconductor layer includes a first region and a second region, the first and second regions of the fourth semiconductor layer being arranged in the first direction, the first region of the fourth semiconductor layer being positioned between the first electrode and the second electrode, the second region of the fourth semiconductor layer being positioned between the control interconnection and the second electrode, and
the first region of the fourth semiconductor layer includes second conductivity type impurities having a higher concentration than a concentration of second conductivity type impurities in the second region of the fourth semiconductor layer.

11. The device according to claim 1, further comprising:
a second electrode provided on a back surface of the semiconductor body, wherein
the semiconductor body further includes a fourth semiconductor layer of the second conductivity type and a fifth semiconductor layer of the first conductivity type, the fourth and fifth semiconductor layers being provided between the first semiconductor layer and the second electrode,
the fourth and fifth semiconductor layers being arranged in the first direction, the fourth semiconductor layer being positioned between the first electrode and the second electrode, the fifth semiconductor layer being positioned between the control interconnection and the second electrode.

12. The device according to claim 1, wherein the semiconductor body further includes a sixth semiconductor layer of the first conductivity type, the sixth semiconductor layer being provided between the first semiconductor layer and the first region of the second semiconductor layer, the sixth semiconductor layer including first conductivity type impurities with a higher concentration than a concentration of first conductivity type impurities in the first semiconductor layer.

* * * * *